United States Patent [19]

Iwamura et al.

[11] Patent Number: 4,769,561
[45] Date of Patent: Sep. 6, 1988

[54] BIPOLAR TRANSISTOR-FIELD EFFECT TRANSISTOR COMPOSITE CIRCUIT

[75] Inventors: Masahiro Iwamura; Ikuro Masuda, both of Hitachi, Japan

[73] Assignee: Hitachi, Ltd., Tokyo, Japan

[21] Appl. No.: 680,495

[22] Filed: Dec. 11, 1984

[30] Foreign Application Priority Data

Dec. 12, 1983 [JP] Japan .................................. 58-232750

[51] Int. Cl.⁴ ............................................ H03K 19/01
[52] U.S. Cl. .................................... 307/446; 307/270; 307/443; 307/475; 307/570
[58] Field of Search ............... 307/200 A, 200 B, 443, 307/446, 475, 570, 270, 300

[56] References Cited

U.S. PATENT DOCUMENTS 4,538,076 8/1985 Shimada ............................... 307/475
4,558,234 12/1985 Suzuki et al. ................... 307/443 X
4,616,146 10/1986 Lee et al. ......................... 307/443 X

FOREIGN PATENT DOCUMENTS 0099100 1/1984 European Pat. Off. ............ 307/570

OTHER PUBLICATIONS

Chin, "Push-Pull Driver Using Bipolar and Complementary Metal-Oxide Semiconductor Devices", IBM TDB, vol. 16, No. 11, Apr. 1974 pp. 3570-3571.

Primary Examiner—Stanley D. Miller
Assistant Examiner—D. R. Hudspeth
Attorney, Agent, or Firm—Antonelli, Terry & Wands

[57] ABSTRACT

A bipolar transistor-complementary field effect transistor composite circuit is provided which includes a pair of first and second bipolar transistors each having a collector of a first conductivity type, a base of a second conductivity type and an emitter of a first conductivity type. Collector-emitter current paths of the bipolar transistors are connected in series to each other between first and second potentials, with a connection node providing an output of the composite circuit. Field effect transistors are respectively coupled between the bases and collectors of the bipolar transistors for controlling the on-off states of the bipolar transistors in opposite relationship to one another in response to an input signal provided to the composite circuit. Also, discharge arrangements are provided for the bases of the first and second bipolar transistors to discharge parasitic capacitance in the bases of the first and second bipolar transistors when they are turned off.

15 Claims, 7 Drawing Sheets

FIG. IA   PRIOR ART
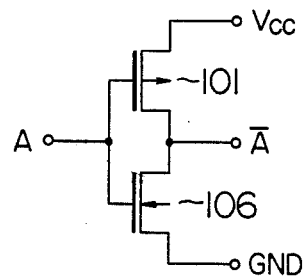
FIG. IB   PRIOR ART
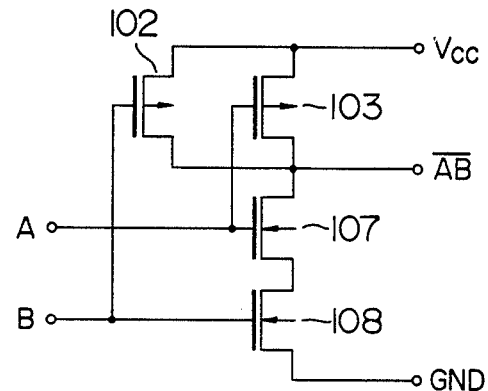
FIG. IC   PRIOR ART
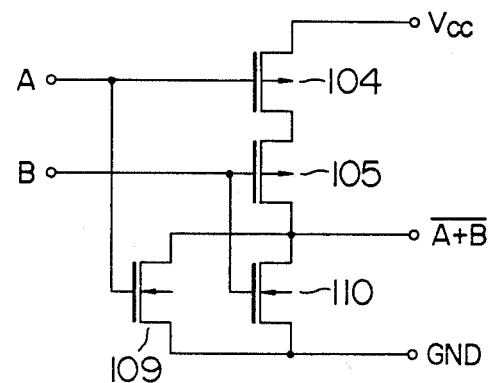

BIPOLAR TRANSISTOR-FIELD EFFECT TRANSISTOR COMPOSITE CIRCUIT

CROSS-REFERENCES OF THE RELATED APPLICATIONS

This application relates to U.S. applications Ser. No. 513,056, filed July 12, 1983 entitled "Gate Circuit of Combined Field-Effect and Bipolar Transistors" (European Patent Application No. 83106796.2 filed July 11, 1983) and Ser. No. 633,476, filed July 23, 1984 entitled "Composite Circuit of Bipolar Transistors and Field Effect Transistors" (European Patent Application No. 84108673.9 filed July 23, 1984), both assigned to the present assignee.

The present invention relates to a composite circuit, and more particularly to a bipolar transistor-field effect transistor composite circuit.

As logic circuits which use complementary field effect transistors, an inverter shown in FIG. 1A, a NAND circuit such as a two-input NAND circuit shown in FIG. 1B and a NOR circuit such as a two-input NOR circuit shown in FIG. 1C have been well known. In FIGS. 1A to 1C, numerals 101, 102, 103, 104 and 105 denote P-channel insulated gate field effect transistors (also referred to as P-channel metal-oxide-semiconductor field effect transistors and abbreviated herein as PMOS), numerals 106, 107, 108, 109 and 110 denote N-channel insulated gate field effect transistors (also referred to as N-channel metal-oxide-semiconductor field effect transistors and abbreviated herein as NMOS).

As a composite circuit which has the same logical function as that of the complementary field effect transistor logic circuit shown in FIG. 1 and uses a combination of complementary field effect transistors and bipolar transistor, an inverter as shown in FIG. 2 has been known (see U.S. Pat. No. 3,541,353)

This inverter comprises a PMOS 201, an NMOS 202, an NPN bipolar transistor (abbreviated herein as NPN) 211 and a PNP bipolar transistor (abbreviated herein as PNP) 212. In this circuit, when an input 221 is at a "0" level, the PMOS 201 is turned on and the NMOS 202 is turned off. Accordingly, base potentials of the NPN 211 and the PNP 212 rise so that the NPN 211 is turned on while the PNP 212 is turned off and an output 222 assumes a "1" level. When the input 221 is at a "1" level, the PMOS 201 is off and the NMOS 202 is on. Accordingly, the base potentials of the NPN 211 and the PNP 212 fall so that the NPN 211 is turned off while the PNP 212 is turned on and the output 222 assumes a "0" level.

Since this circuit uses the complementary bipolar transistors NPN 211 and PNP 212, it is difficult to match switching characteristics of those transistors.

IEEE Trans. Electron Devices, Vol. ED-16, No. 11, Nov. 1969, pages 945–951, FIG. 8 shows an inverter circuit which is shown in FIG. 3.

This inverter comprises a PMOS 201, an NMOS 202, a first NPN 301 and a second NPN 302. In this circuit, when the first and second NPN's 301 and 302 are turned off, there is no means for forcibly discharging parasitic charges stored on their bases. Accordingly, the turn-off time of the NPN's 301 and 302 is long. As a result, a state in which both the first and second NPN's 301 and 302 are on lasts long. This not only increases power consumption but also increases a switching time.

FIG. 10 of the above-referenced article shows an inverter which is shown in FIG. 4. The inverter of FIG. 4 has an NMOS 203 and a PMOS 204 added to the inverter of FIG. 3. The NMOS 203 functions to forcibly discharge parasitic charge stored on the base of the first NPN 301 when it is turned off, and the PMOS 204 functions to forcibly discharge parasitic charge stored in the base of the second NPN 302 when it is turned off. This circuit is faster in operation than the inverter of FIG. 3, but since the NMOS 203 and the PMOS 204 are connected to the input IN, an input capacitance increases and a high operating speed is not attained.

In those prior art circuits, low power consumption and a high operating speed are not attained by the combination of characteristics of the bipolar transistors and the field effect transistors.

It is an object of the present invention to provide a high speed and low power consumption bipolar transistor-field effect transistor composite circuit which overcomes the disadvantages of the prior art composite circuits.

In accordance with one aspect of the present invention, there is provided a bipolar transistor-complementary field effect transistor composite circuit which includes a pair of first and second bipolar transistor each having a collector of a first conductivity type, a base of a second conductivity type and an emitter of the first conductivity type. Collector-emitter current paths of the bipolar transistors are connected in series to each other between first and second potentials, with a connection node providing an output of the composite circuit. Field effect transistors are respectively coupled between the bases and collectors of the bipolar transistors for controlling the on-off states of the bipolar transistors in opposite relationship to one another in response to an input signal provided to the composite circuit. Also, discharge arrangements are provided for the bases of the first and second bipolar transistors to discharge parasitic capacitance in the bases of the first and second bipolar transistors when they are turned off.

Other objects and features of the present invention will be apparent from the following description of the preferred embodiments, taken in conjunction with the accompanying drawings, in which:

FIGS. 1A–1C show prior art CMOS logic circuits,

Figure 9:
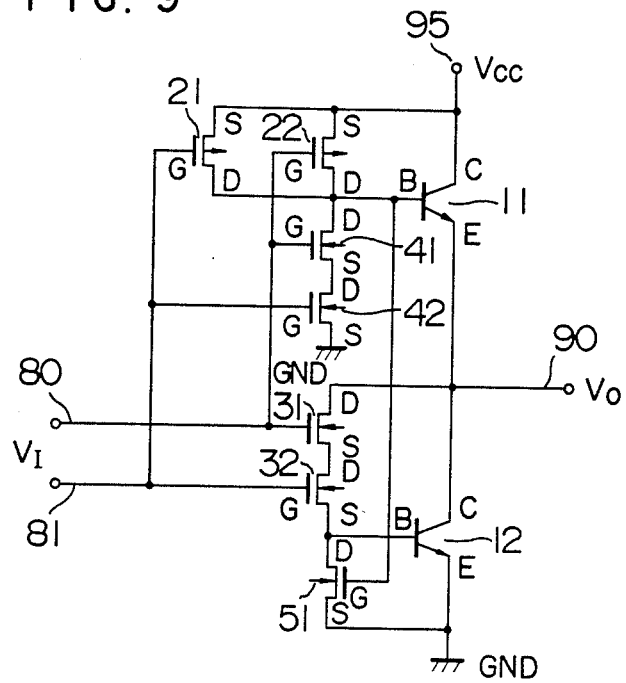
Figure 10:
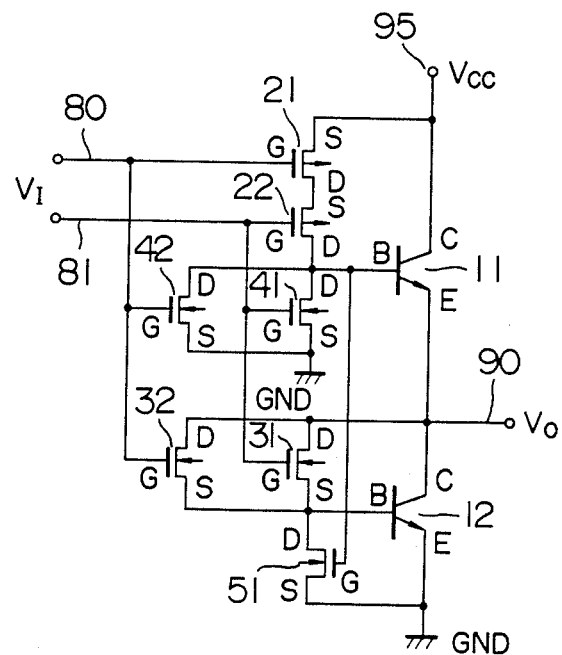
Figure 11:
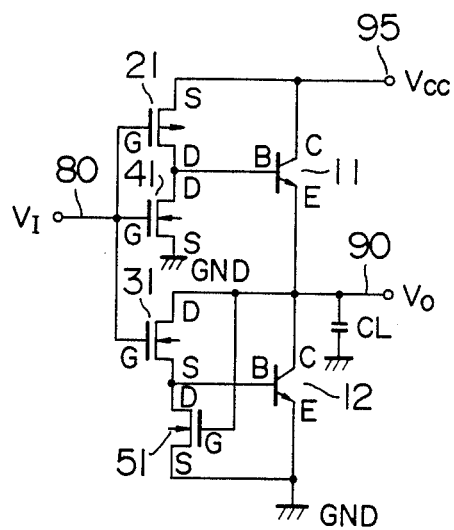
Figure 12:
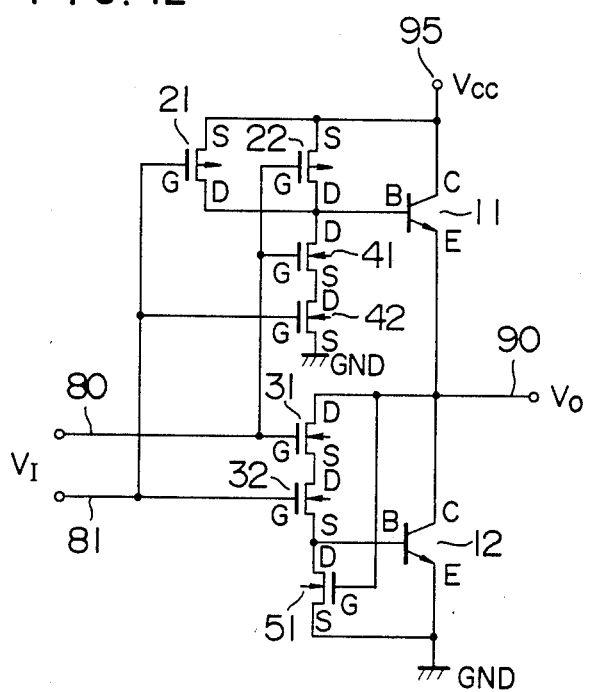
Figure 13:
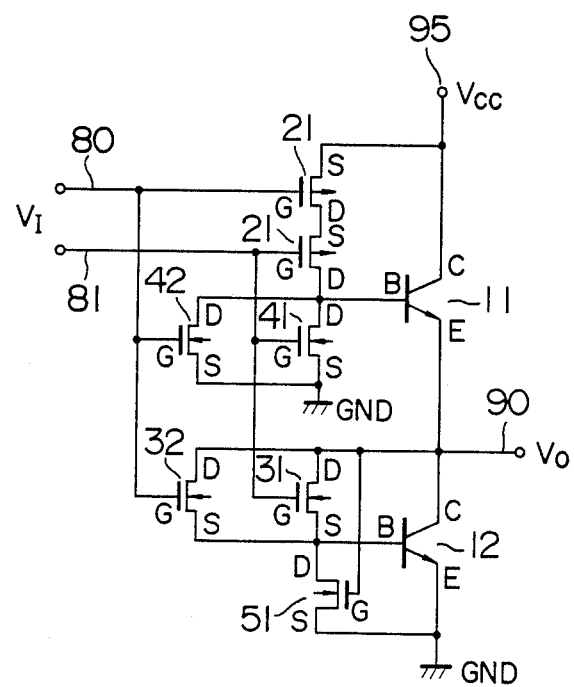

FIG. 9 shows a two-input NAND circuit which is a second embodiment of the present invention, FIG. 10 shows a two-input NOR circuit which is a third embodiment of the present invention, FIG. 11 shows an inverter which is a fourth embodiment of the present invention, FIG. 12 shows a two-input NAND circuit which is a fifth embodiment of the present invention, and FIG. 13 shows a two-input NOR circuit which is a sixth embodiment of the present invention.

The present invention is now explained in detail with respect to the preferred embodiments.

Embodiment 1

Figure 5:
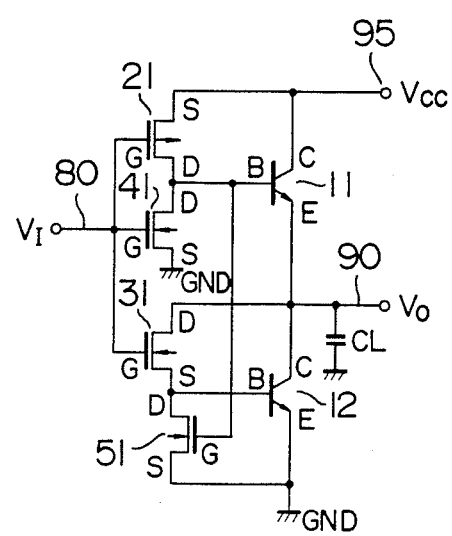
FIG. 5 shows one embodiment of an inverter of the present invention.

FIG. 5 is a circuit diagram of one embodiment of the present invention. Numeral 21 denotes another conductivity type field effect transistor or PMOS, numerals 31, 41 and 51 denote one conductivity type field effect transistors or NMOS's, and numerals 11 and 12 denote first and second NPN's. An N-type collector C of the first NPN 11 is connected to a terminal 95 of a first potential power supply $V_{CC}$, and an N-type emitter E is connected to a terminal 90 of an output $V_O$. An N-type collector C of the second NPN 12 is connected to a terminal 90 of an output $V_O$ and an N-type emitter E is connected to a ground potential GND which is a second potential. A PMOS 21 which is configured in the same manner as the PMOS 101 in the CMOS inverter shown in FIG. 1A is connected between a base B and the collector C of the first NPN 11. That is, a source S of the PMOS 21 is connected to the power supply terminal 95 and the collector C of the first NPN 11, and its drain D is connected to the base B of the first NPN 11.

An NMOS 41 which is configured in the same manner as the NMOS 106 in the CMOS inverter shown in FIG. 1A is connected between the base B of the first NPN 11 and the ground GND. That is, a drain D of the NMOS 41 is connected to the base B of the first NPN 11 and the drain D of the PMOS 21, and a source S is connected to the ground GND.

An NMOS 31 which is configured in the same manner as the NMOS 106 in the CMOS inverter shown in FIG. 1A is connected between a base B and the collector C of the second NPN 12. That is, a drain D of the NMOS 31 is connected to the collector C of the second NPN 12, the emitter E of the first NPN 11 and the output terminal 90, and its source S is connected to the base B of the second NPN 12.

An NMOS 51 which responds to an output of the CMOS inverter constructed by the PMOS 21 and the NMOS 41 is connected between the base B of the second NPN 12 and the ground GND. That is, a gate G of the NMOS 51 is connected to the base B of the first NPN 11 so that the NMOS 51 responds to the output of the CMOS inverter constructed by the PMOS 21 and the NMOS 41, a drain D of the NMOS 51 is connected to the source S of the NMOS 31 and the base B of the second NPN 12, and a source S of the NMOS 51 is connected to the ground GND and the emitter E of the second NPN 12.

The gates of the PMOS 21 and NMOS's 31 and 41 are connected to the input terminal 80 of $V_I$.

The operation of the inverter of the present embodiment is now explained. When the input $V_I$ switches from a low level to a high level, the PMOS 21 is turned off, the NMOS 41 is turned on and the base of the first NPN 11 assumes a low level. Accordingly, the first NPN 11 and the NMOS 51 are turned off. On the other hand, since the NMOS 31 is turned on, the second NPN 12 is turned on and the output $V_O$ switches from the high level to the low level.

When the input $V_I$ switches from the high level to the low level, the NMOS 31 and the second NPN 12 are turned off, the PMOS 21 is turned on, the NMOS 41 is turned off, the base of the first NPN 11 switches to the high level and the first NPN and the NMOS 51 are turned on. Accordingly, the output $V_O$ switches from the low level to the high level.

The function of the NMOS 51 is important for the high speed switching. The NMOS 51 serves as a dynamic discharge circuit. When the input $V_I$ switches from low level to high level, the PMOS 21 is turned off, the NMOS 41 is turned on and the gate G of the NMOS 51 switches from high level to low level so that the NMOS 51 is turned off. Accordingly, since there is no current path between the base B of the second NPN 12 and the ground GND, the current flowing from the output $V_O$ through the NMOS 31 flows into the base B of the second NPN 12 so that the second NPN 12 is rapidly turned on.

When the input $V_I$ switches from high level to low level, the PMOS 21 is turned on, the NMOS 41 is turned off, the gate G of the NMOS 51 switches from low level to high level, and the NMOS 51 is turned on. Accordingly, the base B of the second NPN 12 is grounded through a low impedance path so that the parasitic charge on the base is rapidly discharged. As a result, the turn-off time of the second NPN 12 is reduced and all currents flowing out of the first NPN 11 charge up the load CL so that it is rapidly charged.

When the input $V_I$ is at a high level, the PMOS 21 and the first NPN 11 are turned off, and when the input $V_I$ is at a low level, the NMOS 31 and the second NPN 12 are turned off. Accordingly, the inverter of the present embodiment does not consume power in a steady state as the CMOS circuit does not.

In FIG. 5, it should be noted that the gate G of the NMOS 51 is not connected to the terminal 80 of the input $V_I$ but connected to the base B of the first NPN 11 so that the NMOS 51 responds to the output of the CMOS circuit constructed by the PMOS 21 and the NMOS 41. As compared to the prior art circuit of FIG. 4, the circuit of FIG. 5 has a smaller number of gates connected to the input terminal $V_I$ and hence has a smaller input capacitance and a higher switching speed.

Figure 2:
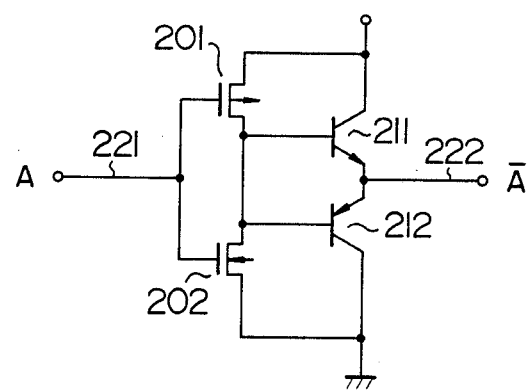
FIGS. 2, 3 and 4 show prior art inverters.
Figure 3:
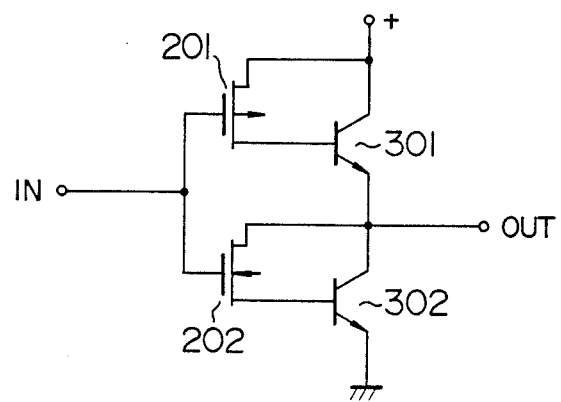
Figure 4:
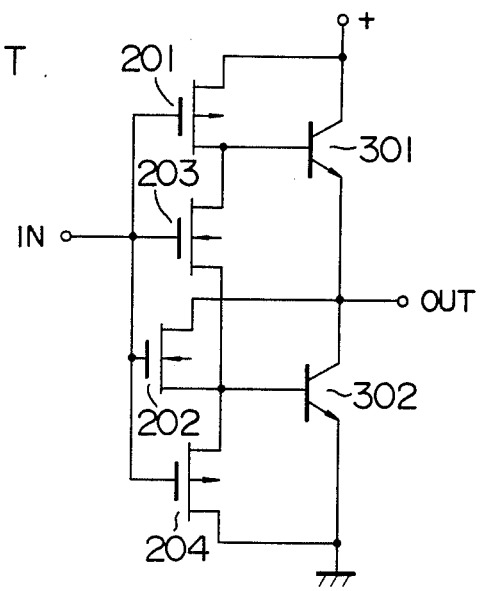

It should also be noted that in the circuit of FIG. 5 the source S of the NMOS 41 is connected to the second potential, that is, the ground GND. When the input $V_I$ switches from the low level to the high level, the PMOS 21 is turned off, the NMOS 41 is turned on, and the base B of the first NPN 11 is grounded through the low impedance so that the parasitic charge in the base is rapidly discharged. Since the parasitic charge in the base B of the first NPN 11 is discharged to the ground without affecting to the second NPN 12, a higher switching speed than that of the prior art circuit of FIG. 4 is attained.

Figure 6:
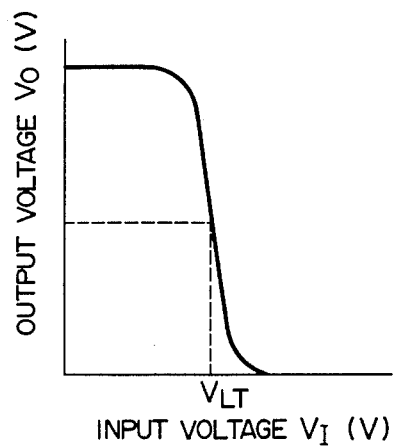
FIG. 6 shows a transfer characteristic of the inverter of FIG. 5.

FIG. 6 shows a transfer characteristic of the inverter of the present invention. A logical threshold voltage $V_{LT}$ of the circuit is usually set to one half of the power supply voltage. When the $V_{LT}$ is to be changed depending on the application, it may be readily attained by selecting a size ratio of the PMOS 21 and the NMOS 41 of FIG. 5.

Figure 7:
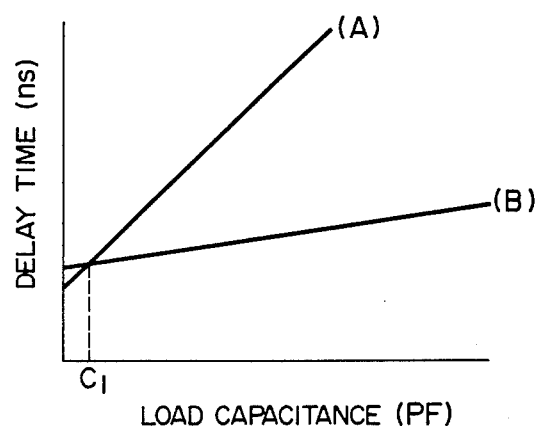
FIG. 7 shows a delay time characteristic of the inverter of FIG. 5.

FIG. 7 shows delay time versus load capacitance characteristics of the CMOS inverter of FIG. 1A and the inverter of FIG. 5. (A) shows the characteristic of the inverter of FIG. 1A, and (b) shows the characteristic of the inverter of FIG. 5. As seen from FIG. 7, the delay time of the inverter of FIG. 5 is slightly longer than that of the CMOS inverter when the load capacitance is below $C_1$, but the former is much shorter than the latter in a high load region in which high driving capabilities are required.

Figure 8:
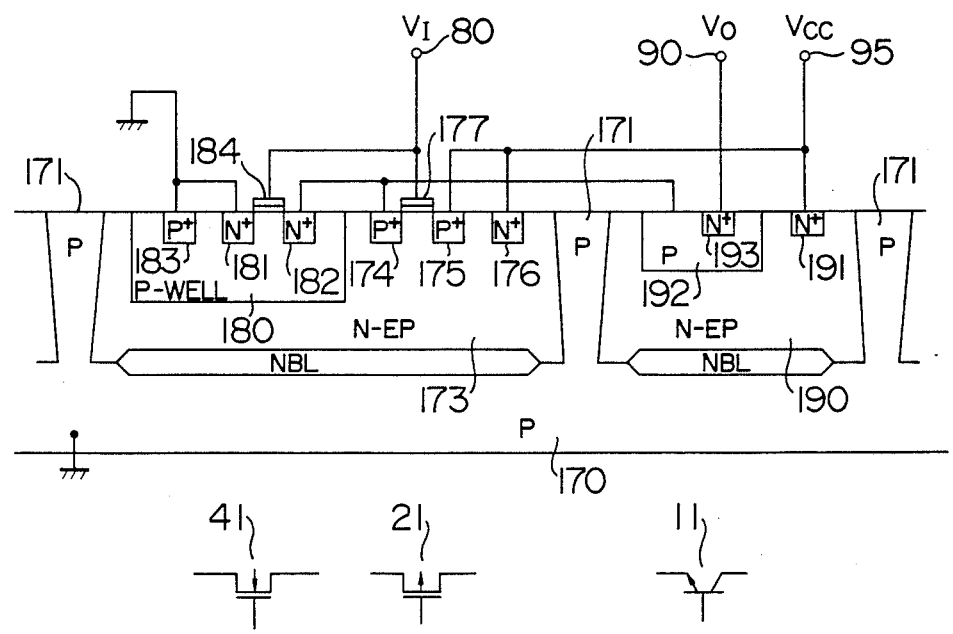
FIG. 8 shows a cross-section of a device of the inverter of FIG. 5.

FIG. 8 shows a cross-section of a device which implements the circuit of FIG. 5. The like elements to those shown in FIG. 5 are designated by the like numerals. In order to avoid complexity in the drawing, only the PMOS 21, NMOS 41 and first NPN 11 are shown in FIG. 8.

Numeral 170 denotes a P-type semiconductor substrate and numeral 171 denotes a p-type isolation layer for isolating devices. The PMOS 21 is formed in an N-type epitaxial layer 173 and drain and source regions are formed by P+ diffusions 174 and 175. The substrate 173 of the PMOS 21 is ohmically contacted by an N+ diffusion 176 and connected to the terminal 95 of the power supply $V_{CC}$. The NMOS 41 is formed in a well region 180 formed on the N-type epitaxial layer by a P-type diffusion, and the source 181 and the drain 182 and formed therein by N+ diffusions. The substrate 180 of the NMOS 41 is ohmically contacted by a P+ diffusion 183 and grounded. Numerals 177 and 184 denote gate electrodes of the PMOS and the NMOS, which are formed by poly-silicon.

The first NPN 11 has an N-type epitaxial layer 190 as the collector, which is ohmically contacted by an N+ diffusion 191 and connected to the terminal 95 of the power supply $V_{CC}$. The base is formed by a P-type base diffusion 192, in which the emitter is formed by an N+ diffusion 193.

NBL is an N+-type high concentration buried layer which is primarily used to reduce a collector resistance of the first NPN 11.

Embodiment 2

FIG. 9 shows a two-input NAND circuit which is a second embodiment of the present invention.

Numerals 11 and 12 denote first and second NPN's, respectively, numerals 21 and 22 denote PMOS's and numerals 31, 32, 41, 42 and 51 denote NMOS's.

A collector C of the first NPN 11 is connected to a terminal 95 of a power supply $V_{CC}$ and its emitter E is connected to a terminal 90 of an output $V_O$. A collector C of the second NPN 12 is connected to the terminal 90 of the output $V_O$ and its emitter E is connected to a second potential, that is, a ground potential GND.

A parallel circuit of the PMOS's 21 and 22 configured in the same manner as the PMOS's 102 and 103 of the CMOS two-input NAND circuit shown in FIG. 1B is connected between a base B and the collector C of the first NPN 11. That is, sources S of the PMOS's 21 and 22 are connected to the power supply terminal 95 and the collector C of the first NPN 11, and the drains D are connected to the base of the first NPN 11.

A series circuit of the NMOS's 41 and 42 configured in the same manner as the NMOS's 107 and 108 in the CMOS two-input NAND circuit shown in FIG. 1B is connected between the base B of the first NPN 11 and the ground potential GND. That is, a drain D of the NMOS 41 is connected to the base B of the first NPN 11 and the drains D of the PMOS's 21 and 22, and a source S of the NMOS 41 is connected to the drain D of the NMOS 42. A source S of the NMOS 42 is connected to the second potential, that is, the ground potential GND.

A series circuit of the NMOS's 31 and 32 configured in the same manner as the NMOS's 107 and 108 in the CMOS two-input NAND circuit shown in FIG. 1B is connected between a base B and the collector C of the second NPN 12. That is, a drain D of the NMOS 31 is connected to the collector C of the second NPN 12 and the terminal 90 of the output $V_O$, and a source S of the NMOS 31 is connected to a drain D of the NMOS 32. A source S of the NMOS 32 is connected to the base B of the second NPN 12.

The NMOS 51 which responds to an output of the CMOS two-input NAND circuit constructed by the parallel circuit of the PMOS's 21 and 22 and the series circuit of the NMOS's 41 and 42 is connected between the base B of the second NPN 12 and the ground potential GND. That is, a gate G of the NMOS 51 is connected to the base B of the first NPN 11 so that the NMOS 51 responds to the output of the CMOS two-input NAND circuit constructed by the parallel circuit of the PMOS's 21 and 22 and the series circuit of the NMOS's 41 and 42, a darin D of the NMOS 51 is connected to the source S of the NMOS 32 and the base B of the second NPN 12, and a source S of the NMO 51 is connected to the ground potential GND and the emitter E of the second NPN 12.

The same input $V_I$ as that to the corresponding NMOS's and PMOS's in the CMOS two-input NAND circuit of FIG. 1B is applied to the parallel circuit of the PMOS's 21 and 22, the series circuit of the NMOS's 31 and 32 and the series circuit of the NMOS's 41 and 42, from the input terminals 80 and 81.

The operation of the two-input NAND circuit of the present embodiment is now described.

Table 1 shows a logic operation of the present embodiment.

TABLE 1

| INPUTS 80, 81 | PMOS's 21, 22 | NMOS's 31, 32 | NMOS's 41, 42 | NMOS 51 | 1ST NPN 11 | 2ND NPN 12 | OUTPUT 90 |
| --- | --- | --- | --- | --- | --- | --- | --- |
| Either one is "0" | Either one is ON | Either one is OFF | Either one is OFF | ON | ON | OFF | "1" |
| Both are "0" | Both are ON | Both are OFF | Both are OFF | ON | ON | OFF | "1" |
| Both are "1" | Both are OFF | Both are ON | Both are ON | OFF | OFF | ON | "0" |

When either one of the inputs 80 and 81 is at the "0" level, either one of the PMOS's 21 and 22 is turned on and either one of the NMOS's 41 and 42 is turned off. Accordingly, the base potential of the first NPN 11 and the gate potential of the NMOS 51 rise, and the first NPN 11 and the NMOS 51 are turned on. Since one of the NMOS's 31 and 32 is turned off at this time, the supply of the base current to the second NPN 12 is stopped and the NMOS 51 is turned on. Accordingly, the base B of the second NPN 12 is grounded through the low impedance so that the parasitic charge on the base is rapidly discharged. That is, the second NPN is turned off. Accordingly, the emitter current of the first NPN charges a load (not shown) connected to the output terminal 90 so that the output $V_O$ rapidly reaches "1" level.

When both inputs 80 and 81 are at the "0" level, both PMOS's 21 and 22 are turned on and both NMOS's 41 and 42 and both NMOS's 31 and 32 are turned off. Accordingly, the operation is the same as above and the output $V_O$ assumes "1" level.

On the other hand, when both inputs 80 and 81 are at the "1" level, both PMOS's 21 and 22 are turned off and both NMOS's 41 and 42 are turned on. Since both PMOS's 21 and 22 are turned off, the supply of the base current to the first NPN 11 is stopped, and the charge stored on the base of the first NPN 11 and parasitic charges of the PMOS's 21 and 22 are discharged to the ground GND through the NMOS's 41 and 42. Accordingly, the first NPN 11 is rapidly turned off and the NMOS 51 is also turned off. The NMOS's 31 and 32 are turned on. As a result, a current is supplied from the "1" level output terminal 90 to the base of the second NPN 12 so that the second NPN 12 is rapidly turned on. Accordingly, the terminal 90 of the output $V_O$ rapidly reaches "0" level. In accordance with the present embodiment, when the first NPN is turned on, the NMOS 41 or 42 is off and hence the current through the PMOS 21 or 22 flows into the base of the the first NPN 11 and the gate of the NMOS 51. Accordingly, the first NPN 11 is rapidly turned on. When the first NPN 11 is turned off, the charge on the base of the first NPN 11 is discharged to the ground potential GND through the ON NMOS's 41 and 42. Accordingly, the first NPN 11 is rapidly turned off and the time duration during which both the first NPN 11 and the second NPN 12 are simultaneously ON is shorter as compared with the prior art circuit, and a through current decreases and power consumption decreases. Since there is little through current in the second NPN 12, a high-speed operation is attained.

While two-input NAND circuit is shown in the present embodiment, the present invention can be applied to a conventional k-input NAND circuit such as a three-input NAND circuit or a four-input NAND circuit.

Embodiment 3

FIG. 10 shows a two-input NOR circuit which is a third embodiment of the present invention.

Numerals 11 and 12 denote first and second NPN's, numerals 21 and 22 denote PMOS's and numerals 31, 32, 41, 42 and 51 denote NMOS's.

A collector C of the first NPN 11 is connected to a first potential, that is a terminal 95 of a power supply $V_{CC}$, and its emitter E is connected to a terminal 90 of an output $V_O$. A collector C of the second NPN 12 is connected to the terminal 90 of the output $V_O$ and its emitter E is connected to a second potential, that is, a ground potential GND.

A series circuit of the PMOS's 21 and 22 configured in the same manner as the series circuit of the PMOS's 104 and 105 of the CMOS two-input NOR circuit shown in FIG. 1C is connected between a base B and the collector C of the first NPN 11. That is, a source S of the PMOS 21 is connected to the power supply terminal 95 and the collector C of the first NPN 11, and its drain D is connected to a source S of the PMOS 22. A drain D of the PMOS 22 is connected to the base of the first NPN 11.

A parallel circuit of the NMOS's 41 and 42 configured in the same manner as the NMOS's 109 and 110 of the CMOS two-input NOR circuit shown in FIG. 1C is connected between the base B of the first NPN 11 and the ground potential GND. That is, drains D of the NMOS's 41 and 42 are connected to the base B of the first NPN 11 and the drain D of the PMOS 22, and sources S of the NMOS's 41 and 42 are connected to the second potential, that is, the ground potential GND.

A parallel circuit of the NMOS's 31 and 32 configured in the same manner as the NMOS's 109 and 110 of the CMOS two-input NAND circuit shown in FIG. 1C is connected between a base and the collector of the second NPN 12. That is, drains D of the NMOS's 31 and 32 are connected to the collector C of the second NPN 12 and the terminal 90 of the output $V_O$, and sources S of the NMOS's 31 and 32 are connected to the base B of the second NPN 12.

The NMOS 51 which responds to an output of the CMOS two-input NOR circuit constructed by the series circuit of the PMOS's 21 and 22 and the parallel circuit of the NMOS's 41 and 42 is connected between the base B of the second NPN 12 and the ground potential GND. That is, a gate G of the NMOS 51 is connected to the base B of the first NPN11 so that the NMOS 51 responds to the output of the CMOS two-input NOR circuit constructed by the series circuit of the PMOS's 21 and 22 and the parallel circuit of the NMOS's 41 and 42, and a drain D of the NMOS 51 is connected to sources S of the NMOS's 31 and 32 and the base B of the second NPN 12, and a source S of the NMOS 51 is connected to the ground potential GND and the emitter E of the second NPN 12.

The same input $V_I$ as that to the corresponding NMOS's and the PMOS's in the CMOS two input NOR circuit shown in FIG. 1C is applied to the series circuit of the PMOS's 21 and 22, the parallel circuit of the NMOS's 31 and 32 and the parallel circuit of the NMOS's 41 and 42, through the input terminals 80 and 81.

The operation of the two-input NOR circuit of the the present embodiment is explained.

Table 2 shows a logic operation of the present embodiment.

TABLE 2

| INPUTS 80, 81 | PMOS's 21, 22 | NMOS's 31, 32 | NMOS's 41, 42 | NMOS 51 | 1ST NPN 11 | 2ND NPN 12 | OUTPUT 90 |
|---|---|---|---|---|---|---|---|
| Both are "0" | Both are ON | Both are OFF | Both are OFF | ON | ON | OFF | "1" |
| Either one is "1" | Either one is OFF | Either one is ON | Either one is ON | OFF | OFF | ON | "0" |
| Both are "1" | Both are OFF | Both are ON | Both are ON | OFF | OFF | ON | "0" |

When both of the inputs 80 and 81 are at the "0" level, both of the PMOS's 21 and 22 are turned on and both of the NMOS's 41 and 42 are turned off. Accordingly, a current through the PMOS's 21 and 22 flows into the base of the first NPN 11 and the gate G of the NMOS 51, and the base potential of the first NPN 11 and the gate potential of the NMOS 51 rapidly rise, and the first NPN 11 and the NMOS 51 are turned on. Since both of the NMOS's 31 and 32 are turned off at this time, the supply of the base current to the second NPN 12 is stopped and the NMOS 51 is turned on. Accordingly, the base B of the second NPN 12 is grounded through the low impedance so that the parasitic charge in the base is rapidly discharged. That is, the second NPN 12 is turned off. Accordingly, the emitter current of the first NPN charges a load (not shown) connected to the output terminal 90 so that the output $V_O$ rapidly reaches the "1" level.

When one of the inputs 80 and 81 is at the "1" level, one of the PMOS's 21 and 22 is turned off and one of the NMOS's 41 and 42 is turned on. Accordingly, the supply of the base current to the first NPN 11 is stopped and the charge stored on the base of the first NPN 11 and parasitic charges of the PMOS's 21 and 22 are discharged to the ground GND through the ON one of the NMOS's 41 and 42. Accordingly, the first NPN 11 is rapidly turned off and the NMOS 51 is also turned off. One of the NMOS's 31 and 32 is turned on. As a result, a current is supplied from the "1" level output terminal 90 to the base of the second NPN 12 so that the second NPN 12 is rapidly turned on. Accordingly, the terminal 90 of the output $V_O$ rapidly reaches the "0" level.

When both of the inputs 80 and 81 are at the "1" level both of the PMOS's 21 and 22 are turned off and all of the NMOS's 31, 32, 41 and 42 are turned on. Accordingly, the operation is same as above and the terminal 90 of the output $V_O$ assumes a "0" level.

While two-input NOR circuit is shown in the present embodiment, the present invention can be applied to a conventional k-input NOR circuit such as a three-input NOR circuit or a four-input NOR circuit.

In accordance with the present embodiment, similar effect to those of the first and second embodiments can be attained and a NOR circuit which is essential in constructing a semiconductor integrated circuit is provided.

Embodiment 4

FIG. 11 shows an inverter which is a fourth embodiment of the present invention.

Only a difference from the first embodiment of FIG. 5 is that the gate G of the NMOS 51 is connected to the emitter E of the first PNP 11, the terminal 90 of the output $V_O$ and the collector C of the second NPN 12. Other construction and the logic operation are identical to those of the first embodiment.

In FIG. 11, the gate G of the NMOS 51 is connected to the emitter E of the first NPN 11 so that the NMOS 51 responds to the CMOS inverter constructed by the PMOS 21 and the NMOS 41.

Embodiment 5

FIG. 12 shows a two-input NAND circuit which is a fifth embodiment of the present invention.

Only a difference from the second embodiment of FIG. 9 is that the gate G of the NMOS 51 is connected to the emitter E of the first PNP 11, the terminal 90 of the output $V_O$ and the collector C of the second NPN 12. Other construction and the logic operation are identical to those of the second embodiment.

In FIG. 12, the gate G of the NMOS 51 is connected to the emitter E of the first NPN 11 so that the NMOS 51 responds to the two-input NAND circuit constructed by the parallel circuit of the PMOS's 21 and 22 and the series circuit of the NMOS's 41 and 42.

While the two-input NAND circuit is shown in the present embodiment, the present invention can be applied to a conventional k-input NAND circuit such as a three-input NAND circuit or a four-input NAND circuit.

Embodiment 6

FIG. 13 shows a two-input NOR circuit which is a sixth embodiment of the present invention.

Only a difference from the third embodiment of FIG. 10 is that the gate G of the NMOS 51 is connected to the emitter E of the first PNP 11, the terminal 90 of the output $V_O$ and the collector C of the second NPN 12. Other construction and the logic operation are identical to those of the third embodiment.

In FIG. 13, the gate G of the NMOS 51 is connected to the emitter E of the first NPN 11 so that the NMOS 51 responds to the two-input NAND circuit constructed by the series circuit of the PMOS's 21 and 22 and the parallel circuit of the NMOS's 41 and 42.

While the two-input NOR circuit is shown in the present embodiment, the present invention can be applied to a conventional k-input NOR circuit such as a three-input NOR circuit or a four-input NOR circuit.

The present invention can be modified within the scope of the concept thereof.

For example, the bipolar transistors may be Schottky barrier diode coupled bipolar transistors, and the composite circuit of the present invention may be used as an output buffer circuit or an input buffer circuit.

While NAND circuit and NOR circuit are explained as the logic circuits in the enbodiments of the present invention, CMOS transistor logic circuits may be connected in a succeeding stage of those logic circuits so that other logic circuits such as AND circuit and OR circuit, or a combinational logic circuit or a sequential logic circuit such as a flip-flop, a shift register or a latch can be constructed. Those are within the scope of the present invention.

The present invention thus provides a high speed and low power consumption field effect transistor-bipolar transistor composite circuit.

We claim:

1. A bipolar transistor-complementary field effect transistor composite circuit comprising:
    a first bipolar transistor having a collector of a first conductivity type connected to a first potential, a base of a second conductivity type and an emitter of the first conductivity type connected to an output terminal;
    a second bipolar transistor having a collector of the first conductivity type connected to said output terminal, a base of the second conductivity type and an emitter of the first conductivity type connected to a second potential;
    k input terminals ($k \geq 1$);
    k first field effect transistors of the second conductivity type, having their gates connected to a corresponding input terminal, and having their source-drain paths connected between said base and said collector of said first bipolar transistor, respectively;
    k second field effect transistors of the first conductivity type, having their gates connected to a corresponding input terminal, and having their source-drain paths connected between said base of said first bipolar transistor and said second potential, respectively;

k third field effect transistors of the first conductivity type, having their gates connected to a corresponding input terminal, and having their source-drain paths connected between said base and said collector of said second bipolar transistor, respectively; and a discharge means coupled to the base of said second bipolar transistor for discharging the parasitic charge in the base of said second bipolar transistor.

2. A composite circuit according to claim 1, wherein said discharge means comprises a fourth field effect transistor of the first conductivity type, having a gate connected to said first bipolar transistor to be activated upon activation of said first bipolar transistor, and a source-drain path connected between said base of said second bipolar transistor and said second potential.

3. A composite circuit according to claim 2, wherein said k first, said k second, said k third and said fourth field effect transistors are MOS transistors.

4. A composite circuit according to claim 2, wherein said gate of said fourth field effect transistor is connected to said base of said first bipolar transistor.

5. A composite circuit according to claim 2, wherein said gate of said fourth field effect transistor is connected to said emitter of said first bipolar transistor.

6. A composite circuit according to claim 1, wherein said first potential is higher than said second potential.

7. A composite circuit according to claim 6, wherein said first potential is a power supply potential, and said second potential is a group potential.

8. A composite circuit according to claim 1, wherein the first conductivity type is N-type, and the second conductivity type is p-type.

9. A bipolar transistor-complementary field effect transistor composite circuit comprising:

a pair of first and second bipolar transistors each having a collector of a first conductivity type, a base of a second conductivity type and emitter of the first conductivity type, and collector-emitter current paths of said pair of bipolar transistors connected in series to each other between first and second potentials, wherein a connection node between said collector-emitter current paths provides an output of the composite circuit;

a first field effect transistor of the second conductivity type responsive to a predetermined input for forming a current path from said first potential to the base of said first bipolar transistor to output a signal for rendering said first bipolar transistor in the on or off state;

a second field effect transistor of the first conductivity type responsive to said predetermined input for forming a current path from the base of said first bipolar transistor to said second potential to discharge parasitic charge in the base of said first bipolar transistor when it is turned into the off state;

a third field effect transistor of the first conductivity type responsive to said predetermined input for forming an current path from said output connecton node to the base of said second bipolar transistor to output another signal for rendering said second bipolar transistor in the on or off state in an opposite relation to the on-off state of said first bipolar transistor; and discharge means for discharging parasitic charge in one base of said second bipolar transistor when it is turned into the off state.

10. A composite circuit according to claim 9, wherein said discharge means is a fourth field effect transistor of the first conductivity type switched into an on state when said first bipolar transistor is on, for forming a current path from the base of said second bipolar transistor to said second potential, and switched into an off state when said first bipolar transistor is off.

11. A composite circuit according to claim 10, wherein said fourth field effect transistor has its gate connected to the base of said first bipolar transistor, and its drain and source connected to the base of the second bipolar transistor and said second potential, respectively.

12. A composite circuit according to claim 10, wherein said fourth field effect transistor has its gate connected to the emitter of said first bipolar transistor, and its drain and source connected to the base of said second bipolar transistor and said second potential, respectively.

13. A composite circuit according to claim 9, wherein said first potential is a power supply potential, and said second potential is a group potential.

14. A composite circuit according to claim 1, wherein said respective first and second bipolar transistors and said first, second and third field effect transistors are arranged to operate as an emitter.

15. A gate circuit comprising:

at least one input terminal;

an output terminal;

a first bipolar transistor having its emitter-collector current path coupled between a first supply voltage terminal and said output terminal;

a second bipolar transistor having its emitter-collector current path coupled between said output terminal and a second supply voltage terminal;

at least one first MOS transistor having its drain-source current path coupled between said first supply voltage terminal and a base of said first bipolar transistor, said first MOS transistor having a control electrode coupled to said input terminal;

at least one second MOS transistor having its drain-source current path coupled between said output terminal and a base of said second bipolar transistor, said second MOS transistor having a control electrode coupled to said input terminal;

at least one third MOS transistor having its drain-source current path coupled between said base of said first bipolar transistor and said second supply voltage terminal, and having a control electrode to said input terminal; and a MOS transistor having its drain-source current path coupled between said base of said second bipolar transistor and said second supply voltage terminal, and having a control electrode coupled to said base of said first bipolar transistor.

* * * * *